(12) United States Patent
Pikulin et al.

(10) Patent No.: US 11,707,000 B2
(45) Date of Patent: Jul. 18, 2023

(54) SIDE-GATING IN SELECTIVE-AREA-GROWN TOPOLOGICAL QUBITS

(71) Applicant: Microsoft Technology Licensing, LLC, Redmond, WA (US)

(72) Inventors: Dmitry Pikulin, Goleta, CA (US); Michael H. Freedman, Santa Barbara, CA (US); Roman Lutchyn, Santa Barbara, CA (US); Peter Krogstrup Jeppesen, Frederiksberg (DK); Parsa Bonderson, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 629 days.

(21) Appl. No.: 16/756,437

(22) PCT Filed: Jun. 27, 2018

(86) PCT No.: PCT/US2018/039833
§ 371 (c)(1),
(2) Date: Apr. 15, 2020

(87) PCT Pub. No.: WO2019/074557
PCT Pub. Date: Apr. 18, 2019

(65) Prior Publication Data
US 2020/0287120 A1  Sep. 10, 2020

Related U.S. Application Data

(60) Provisional application No. 62/572,560, filed on Oct. 15, 2017.

(51) Int. Cl.
*H10N 60/01* (2023.01)
*G06N 10/00* (2022.01)
(Continued)

(52) U.S. Cl.
CPC ............ *H10N 60/01* (2023.02); *G06N 10/00* (2019.01); *H10N 60/128* (2023.02); *H10N 60/84* (2023.02)

(58) Field of Classification Search
None
See application file for complete search history.

(56) References Cited

U.S. PATENT DOCUMENTS 7,109,593 B2   9/2006   Freedman et al.
7,250,624 B1   7/2007   Freedman et al.
(Continued)

FOREIGN PATENT DOCUMENTS

WO   WO-2018035360 A1 *   2/2018   .............. G06N 10/00
WO   WO-2018035361 A1 *   2/2018   .............. G06F 15/80

OTHER PUBLICATIONS

Non-Final Office Action issued in U.S. Appl. No. 12/187,850, dated Aug. 29, 2011, 22 pages.
(Continued)

*Primary Examiner* — Scott B Geyer
(74) *Attorney, Agent, or Firm* — Klarquist Sparkman, LLP

(57) ABSTRACT

A quantum device is fabricated by forming a network of nanowires oriented in a plane of a substrate to produce a Majorana-based topological qubit. The nanowires are formed from combinations of selective-area-grown semiconductor material along with regions of a superconducting material. The selective-area-grown semiconductor material is grown by etching trenches to define the nanowires and depositing the semiconductor material in the trenches. A side gate is formed in an etched trench and situated to control a topological segment of the qubit.

15 Claims, 11 Drawing Sheets

(51) Int. Cl.
H10N 60/84 (2023.01)
H10N 60/10 (2023.01)

(56) References Cited

U.S. PATENT DOCUMENTS

| | | |
|---|---|---|
| 9,517,931 B2 | 12/2016 | Freedman et al. |
| 2003/0057441 A1 | 3/2003 | Ivanov et al. |
| 2006/0043423 A1 | 3/2006 | Freedman et al. |
| 2006/0045269 A1 | 3/2006 | Freedman et al. |
| 2006/0091375 A1 | 5/2006 | Freedman et al. |
| 2007/0080339 A1 | 4/2007 | Freedman et al. |
| 2007/0162407 A1 | 7/2007 | Freedman et al. |
| 2009/0079421 A1 | 3/2009 | Freedman et al. |
| 2012/0221268 A1 | 8/2012 | Freedman et al. |
| 2013/0299783 A1 | 11/2013 | Lutchyn et al. |
| 2014/0094372 A1* | 4/2014 | Englund ............... H01L 31/032 505/181 |
| 2014/0279822 A1* | 9/2014 | Bonderson ............. G06N 10/00 706/62 |
| 2014/0354326 A1* | 12/2014 | Bonderson ............. G06N 10/00 505/170 |
| 2017/0161632 A1 | 6/2017 | Freedman et al. |
| 2018/0052806 A1 | 2/2018 | Hastings et al. |
| 2018/0053113 A1* | 2/2018 | Lutchyn ................. H10N 60/11 |
| 2018/0053809 A1 | 2/2018 | Freedman et al. |
| 2018/0195201 A1* | 7/2018 | Krogstrup ............... C30B 11/12 |

OTHER PUBLICATIONS

Sarma et al., "Topologically-Protected Qubits from a Possible Non-Abelian Fractional Quantum Hall State," Physical Review Letters, vol. 94, Issue 16, 5 pages (Dec. 22, 2004).
Non-Final Office Action issued in U.S. Appl. No. 13/465,374, dated Oct. 28, 2015, 17 pages.
Raussendorf et al., "Quantum Computing via Measurements Only," available at: arXiv:quant-ph/0010033v1, 4 pages (Oct. 7, 2000).
Non-Final Office Action issued in U.S. Appl. No. 15/376,539, dated Feb. 26, 2018, 8 pages.
Potter et al., "Erratum: Engineering a p+ip Superconductor: Comparison of Topological Insulator and Rashba Spin-Orbit Coupled Materials," Physical Review B, vol. 83, Issue 18, 2 pages (Aug. 2011).
Application as filed in U.S. Appl. No. 62/382,253, filed Aug. 31, 2016, 55 pages.
Application as filed in U.S. Appl. No. 62/385,245, filed Sep. 8, 2016, 49 pages.
Aaronson, Scott, "Quantum Computing, Postselection, and Probabilistic Polynomial-Time," Proceedings of the Royal Society A: Mathematical, Physical and Engineering Sciences, vol. 461, Issue 2063, 9 pages (Nov. 8, 2005).
Abrams et al., "Nonlinear Quantum Mechanics Implies Polynomial-Time Solution for NP-Complete and #P Problems," available at: arxiv:quant-ph/9801041v1, 10 pages (Jan. 21, 1998).
Antipov et al., "Effects of Gate-Induced Electric Fields on Semiconductor Majorana Nanowires," Physical Review X, vol. 8, Issue 3, 19 pages (Aug. 13, 2018).
Bonderson et al., "Detecting Non-Abelian Statistics in the v=5/2 Fractional Quantum Hall State," Physical Review Letters, vol. 96, Issue 1, 5 pages (Jan. 6, 2006).
Bonderson et al., "Measurement-Only Topological Quantum Computation," Physical Review Letters, vol. 101, Issue 1, 4 pages (Jun. 30, 2008).
Bonderson, Parsa Hassan, "Non-Abelian Anyons and Interferometry," thesis submitted for partial fulfillment of the requirement for the Degree of Doctor of Philosophy, 138 pages (May 23, 2007).
Bravyi et al., "Universal Quantum Computation with Ideal Clifford Gates and Noisy Ancillas," Physical Review A, vol. 71, 14 pages (Feb. 22, 2005).
Bravyi, Sergey, "Universal Quantum Computation with the v=5/2 Fractional Quantum Hall State," Physical Review A, vol. 73, Issue 4, 17 pages (Apr. 12, 2006).

Fidkowski et al., "From Strings Nets to Nonabelions," Communications in Mathematical Physics, vol. 287, Issue 3, 13 pages (Oct. 20, 2006).
Freedman et al., "A Modular Functor Which is Universal for Quantum Computation," Communications in Mathematical Physics, vol. 227, Issue 3, pp. 605-622 (Jun. 1, 2002).
Freedman et al., "Simulation of Topological Field Theories by Quantum Computers," Technical Report MSR-TR-2000-237, 26 pages (Apr. 6, 2000).
Freedman et al., "The Two-Eigenvalue Problem and Density of Jones Representation of Braid Groups," Communications in Mathematical Physics, vol. 228, Issue 1, 23 pages (Jun. 1, 2002).
Freedman et al., "Topological Quantum Computation," Bulletin of the American Mathematical Society, vol. 40, Issue 1, pp. 31-38 (Oct. 10, 2002).
Freedman et al., "Towards Universal Topological Quantum Computation in the v= 5/2 Fractional Quantum Hall State," Physical Review B, vol. 73, Issue 24, 23 pages (Dec. 5, 2005).
Gazibegovic et al., "Epitaxy of Advanced Nanowire Quantum Devices," Journal of Nature, vol. 548, 35 pages (Aug. 2017).
Hou et al., "Wormhole" Geometry for Entrapping Topologically Protected Qubits in Non-Abelian Quantum Hall States and Probing Them with Voltage and Noise Measurements, Physical Review Letters, vol. 97, Issue 14, 4 pages (Oct. 2, 2006).
Janzing et al., "BQP-Complete Problems Concerning Mixing Properties of Classical Random Walks on Sparse Graphs," available at: arxiv:quant-ph/0610235v2, 24 pages (Oct. 28, 2006).
Karzig et al., "Scalable Designs for Quasiparticle-Poisoning-Protected Topological Quantum Computation with Majorana Zero Modes," available at: arXiv:1610.05289v3, 34 pages (Mar. 13, 2017).
Kauffman et al., "Braiding Operators are Universal Quantum Gates," New Journal of Physics, vol. 6, 40 pages (Oct. 19, 2004).
Kitaev, A. Yu., "Fault-Tolerant Quantum Computation by Anyons," Journal of Annals Physics, vol. 303, Issue 1, 27 pages (Oct. 18, 2007).
Law et al., "Electronic Mach-Zehnder Interferometer as a Tool to Probe Fractional Statistics," Physical Review B, vol. 74, Issue 4, 22 pages (Apr. 17, 2006).
Majorana, Nota Di Ettore, "Teoria Simmetrica Dell Elettrone E Del Positrone", II Nuovo Cimento, pp. 171-183 (Apr. 1, 1937).
Mao et al., "Hole-Doped Semiconductor Nanowire on Top of an s-Wave Superconductor: A New and Experimentally Accessible System for Majorana Fermions," Physical Review Letters, 5 pages (Apr. 24, 2012).
McMillan, W. L., "Tunneling Model of the Superconducting Proximity Effect," Physical Review, vol. 175, Issue 2, pp. 537-542 (Nov. 10, 1968).
Motrunich et al., "Griffiths Effects and Quantum Critical Points in Dirty Superconductors without Spin-Rotation Invariance: One-Dimensional Examples," Physical Review B, vol. 63, Issue 224204, 13 pages (May 22, 2001).
Mravlje, Jernej, "Anyons in the Fractional Quantum Hall Effect," retrieved from: http://www-f1.ijs.si/~mravlje/fqhe.pdf, 2005, 14 pages.
Nadj-Perge et al., "Spin-Orbit Qubit in a Semiconductor Nanowire," Nature—International Weekly Journal of Science, 11 pages (Dec. 2010).
Nayak et al., "2n Quasihole States Realize 2n-1Dimensional Spinor Braiding Statistics in Paired Quantum Hall States," Nuclear Physics B, 38 pages (May 1996).
Nayak, Chetan, "Exotic Matter: Another Dimension for Anyons," Nature—International Weekly Journal of Science, vol. 464, 2 pages (Apr. 2010).
Nayak et al., "Non-Abelian Anyons and Topological Quantum Computation," Reviews of Modern Physics, vol. 80, Issue 3, 73 pages (Mar. 28, 2008).
Nilsson et al., "Giant, Level-Dependent g Factors in InSb Nanowire Quantum Dots," Nano Letters, vol. 9, Issue 9, pp. 3151-3156 (Aug. 2009).
Nilsson et al., "Splitting of a Cooper Pair by a Pair of Majorana Bound States," Physical Review Letters, 4 pages (Aug. 15, 2008).

(56) References Cited

OTHER PUBLICATIONS

International Search Report and Written Opinion issued in PCT Application No. PCT/US08/75518, dated Mar. 31, 2009, 10 pages.
Oreg et al., "Helical Liquids and Majorana Bound States in Quantum Wires," Physical Review Letters, vol. 105, Issue 17, 5 pages (Oct. 20, 2010).
Palmer, Rebecca N., "Entanglement Detection and Fractional Quantum Hall Effect in Optical Lattices," thesis submitted for the Degree of Doctor of Philosophy in Physics, 2007, 108 pages.
International Search Report and Written Opinion dated Oct. 4, 2018, from International Patent Application No. PCT/US2018/039833, 16 pp.
Ooike et al., "Fabrication of GaAs nanowrire devices with self-aligning W-gate electrodes using selective-area MOVPE," *Thin Solid Films*, vol. 464-465, pp. 220-224 (Oct. 2004).

\* cited by examiner

SIDE-GATING IN SELECTIVE-AREA-GROWN TOPOLOGICAL QUBITS

CROSS REFERENCE TO RELATED APPLICATIONS

This application is the U.S. National Stage of International Application No. PCT/US2018/039833, filed Jun. 27, 2018, which was published in English under PCT Article 21(2), which in turn claims the benefit of U.S. Provisional Application No. 62/572,560, filed Oct. 15, 2017. The provisional application is incorporated herein in its entirety.

FIELD

This application concerns combinations of selective area grown (SAG) semiconductors along with superconductive regions.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SE/SU) nanowires. With regard to the latter, a key advance in the field was the realization that non-abelian anyons, in the form of "Majorana zero modes" (MZMs), can be formed in regions of semiconductor (SE) coupled to a superconductor (SU). Based on this phenomenon, a small network of SE/SU nanowires can be used to create a quantum bit, wherein each SE/SU nanowire comprises a length of semiconductor coated with a superconductor.

A quantum bit, or qubit, is an element upon which a measurement with two possible outcomes can be performed, but which at any given time (when not being measured) can in fact be in a quantum superposition of the two states corresponding to the different outcomes.

A "topological" qubit is a qubit implemented based on the above-mentioned technology of non-abelian anyons in the form of MZMs. A non-abelian anyon is a type of quasiparticle, meaning not a particle per se, but an excitation in an electron liquid that behaves at least partially like a particle. Particularly an anyon is a quasiparticle occurring in a two-dimensional system (two degrees of freedom in space). A Majorana zero mode is a particular bound state of such quasiparticles. Under certain conditions, these states can be formed in close to the semiconductor/superconductor interface in an SE/SU nanowire network, in a manner that enables them to be manipulated as quantum bits for the purpose of quantum computing. Regions or "segments" of the nanowire network between the MZMs are said to be in the "topological" regime.

A Majorana-based qubit requires gating in order to exhibit such topological behaviour. That is, an electrical potential is applied to a segment of the semiconductor of one of the nanowires forming the qubit. The potential needs to be "tuned" to the right level in order to induce the topological regime in the said segment.

SUMMARY

The concepts of Majorana-based topological qubits, and the gating thereof, are in themselves understood in the art. It is an aim of the present disclosure to improve such gating by improving the electrostatic coupling between the gate and the topological segment of the qubit. This is achieved by entrenching a side gate into the same layer as the semiconductor material used to fabricate the nanowires.

According to one aspect disclosed herein, there may be provided a method for fabricating a quantum device, the method comprising:

providing a substrate and an insulator formed on the substrate;

from combinations of selective-area-grown semiconductor material along with regions of a superconducting material, forming a network of nanowires oriented in a plane of the substrate which can be used to produce a Majorana-based topological qubit; and fabricating a side gate for controlling a topological segment of the qubit;

wherein the selective-area-grown semiconductor material is grown on the substrate, by etching trenches in the insulator formed on the substrate to define the nanowires and depositing the semiconductor material in the trenches defining the nanowires; and wherein the fabricating of the side gate comprises etching the dielectric to create a trench for the side gate and depositing the side gate in the trench for the side gate.

In embodiments, the side gate may be fabricated from one of the regions of selective area grown semiconductor. In some such embodiments, the side gate may be formed in the same fabrication steps as the topological qubit.

In embodiments, the regions of superconducting material may include regions coated on the semiconductor material that is deposited in the trenches defining the nanowires.

In embodiments, the regions of superconductor may be deposited simultaneously using a mechanical mask.

In embodiments, the insulator formed on the substrate may be a dielectric.

In embodiments, the method may further comprise covering the insulator formed on the substrate and the side gates with a further, protective insulating layer.

In embodiments the forming of the nanowires comprises forming a plurality of networks of nanowires each of which can be used to produce a Majorana-based topological qubit, and the fabrication comprises fabricating one or more side gates for each network of nanowires (e.g. three side gates for each network); wherein the fabricating of the side gates comprises etching the dielectric to create trenches for the side gates and depositing the side gates in said trenches for the side gates.

According to another aspect disclosed herein, there may be provided a method of fabricating a quantum device, the method comprising:

providing a substrate defining a plane;

forming a layer over the substrate wherein said layer comprises a) an insulator (e.g. dielectric), b) trenches in the insulator in the plane of the substrate, the trenches including one or more networks of first trenches, and c) selective-area-grown semiconductor material in the first trenches; and coating the selective-area-grown semiconductor in each of the one or more networks of first trenches with regions of superconductor material, thereby forming a corresponding one or more networks of semiconductor-superconductor nanowires, wherein each of the networks of nanowires is configured to be usable to provide a Majorana-based topological qubit;

wherein the trenches in said layer further include one or more second trenches for each one of the networks of nanowires (e.g. three gates per qubit), each of the second trenches being adjacent to but not continuous with a respective one of the first trenches of the corresponding network of first trenches; and wherein said layer further includes a respective side gate formed in each of the second trenches, adjacent to a topological segment of one of the nanowires but not touching any of the nanowires;

the side gate or gates thereby being entrenched in the insulator in said layer along with the semiconductor material of the nanowires.

In other words, at least part of each of the side gates embedded in the insulator forming on the substrate falls in the same geometric plane (in the plane of the substrate) as at least part of the semiconductor of their respective nanowires. I.e. in a side-on cross-section, within the insulator of said layer, at least part of the side gate falls below the top of the semiconductor of the respective nanowire.

In embodiments, the side-gate may be formed from a region of the selective-area-grown semiconductor. The insulator in said layer may be a mask in which the trenches are formed (e.g. etched), and the selective area-grown semiconductor may be deposited into the trenches of the mask. The side gate may be formed in the same fabrication steps (same etching and deposition steps) as the semiconductor of the nanowires. Alternatively they may be formed in separate steps.

In embodiments, the trenches include a plurality of networks of first trenches (with selective-area-grown semiconductor material therein), and the coating comprises coating the selective-area-grown semiconductor in each of the networks of first trenches with regions of superconductor material, thereby forming respective networks of semiconductor-superconductor nanowires, each network for providing a Majorana-based topological qubit; wherein the trenches in said formed layer further include a plurality of second trenches, and the forming of said layer comprises including in each of the second trenches a respective side-gate adjacent to a topological segment of a respective one of the nanowires but not touching the nanowires, the side-gates thereby being entrenched in the insulator in said layer along with the semiconductor of the nanowires; and wherein one of more of the side gates are thus provided per one of the qubits.

In embodiments the method may further comprise forming a protective insulator over some or all of said layer.

The following embodiments may apply to any of the above aspects.

In embodiments the substrate itself may be an insulating material. In embodiments the insulator (e.g. mask) formed on the substrate may be a dielectric. In embodiments the dielectric may be SiOx. In embodiments the substrate may be an InP substrate. In embodiments the semiconductor material may be InAs. Alternatively the semiconductor material may be any other suitable semiconductor such as InSb. In embodiments the superconductor material may be Al. Alternatively any other suitable superconductor may be used, such as Nb or TiN. In embodiments the side-gate may be Au or Al doped InAs. More generally the side-gate may be formed from any conductor, superconductor, or semiconductor-doped conductor or superconductor. In embodiments the protective insulating layer may be HfO.

In embodiments, the superconducting material may be deposited as a uniform layer, but where a shadow from the selective-area-grown semiconducting material may be used to form a gap between the semiconductor material and the superconducting material.

In embodiments a region of the superconducting material that do not touch the semiconductor material may be used to form the side gate, while regions of the superconducting material in direct contact with the semiconductor material may be used to induce superconductivity.

In embodiments, the regions of superconducting material may form superconducting islands, some parts of which are topological and some parts of which are non-topological; wherein said topological segment may be one of said topological parts.

In embodiments the non-topological parts may be s-wave superconductors.

In embodiments Majorana zero modes may appear in pairs at the ends of linear parts of the topological segments, and where the qubit comes into contact with either an s-wave superconductor or an insulator.

In embodiments the etching may be by lithography.

In embodiments the growth of the semiconductor material and/or the depositing of the side gate may be by epitaxy According to another aspect disclosed herein, there may be provided a quantum device fabricated according to any of the disclosed methods.

Thus according to one aspect disclosed herein, there may be provided a quantum device comprising:

a substrate and an insulator formed on the substrate;

combinations of selective-area-grown semiconductor material along with regions of a superconducting material, forming a network of nanowires oriented in the plane of the substrate which can be used to produce a Majorana-based topological qubit; and a side gate for controlling a topological segment of the qubit;

wherein the selective-area-grown semiconductor material is buried in trenches in the insulator which define the nanowires, and wherein side gate is also buried in a trench in the insulator.

According to another aspect disclosed herein, there may be provided a quantum device comprising:

a substrate defining a plane;

a layer over the substrate wherein said layer comprises a) an insulator (e.g. dielectric), b) trenches in the insulator in the plane of the substrate, the trenches including one or more networks of first trenches, and c) selective-area-grown semiconductor material in the first trenches; and regions of superconductor material coated on the selective-area-grown semiconductor in each of the one or more networks of first trenches, thereby forming a corresponding one or more networks of semiconductor-superconductor nanowires, wherein each of the networks of nanowires is configured to be usable to provide a Majorana-based topological qubit;

wherein the trenches in said layer further include one or more second trenches for each one of the networks of nanowires (e.g. two or three gates per qubit), each of the second trenches being adjacent to but not continuous with a respective one of the first trenches of the corresponding network of first trenches; and wherein said layer further includes a respective side gate formed in each of the second trenches, adjacent to a topological segment of one of the nanowires but not touching any of the nanowires;

the side gate or gates thereby being entrenched in the insulator in said layer along with the semiconductor material of the nanowires.

In embodiments the device may further comprise features in accordance with any of the disclosed methods.

According to another aspect disclosed herein, there may be provided a method of operating the quantum device, the method comprising using the side gate to tune said segment into a topological regime.

According to another aspect disclosed herein, there may be provided a quantum computer or quantum circuit comprising a quantum device according to any embodiment disclosed herein.

According to another aspect disclosed herein, there may be provided a quantum device, comprising: a selective area growth heterostructure configured to realize a quad qubit; and one or more selective area growth side gates configured to tune the Fermi energy of one or more topological segments of the selective area growth heterostructure.

According to another aspect disclosed herein, there may be provided a quantum device, comprising: a selective area growth heterostructure configured to realize a hexon qubit; and one or more selective area growth side gates configured to tune the Fermi energy of one or more topological segments of the selective area growth heterostructure.

According to another aspect disclosed herein, there may be provided a method comprising electrically controlling a side gate located adjacent to a topologically protected segment of a qubit, and thereby creating a state in the topologically protected segment in which a Majorana zero mode pair.

BRIEF DESCRIPTION OF THE DRAWINGS

For a better understanding of the present technology, and to show how embodiments may be carried into effect, reference is made, by way of example only, to the following figures.

DETAILED EMBODIMENTS OF THE DISCLOSED TECHNOLOGY

Epitaxial semiconductor-superconductor materials are a promising platform for gatable low-dissipation superconducting electronics and superconducting quantum computation. In the context of topological quantum computing, superconducting nanowires with strong spin-orbit coupling can support topological excitations that can serve as the basis for fault tolerant quantum information processing.

Current approaches to synthesize semiconductor-superconductor materials for gatable superconducting nanowire electronics are either based on two-dimensional planar materials (see, e.g., Shabani et al. PRB 93, 155402 (2016)) or bottom up grown nanowire materials (see, e.g., Krogstrup et al. Nature Mater. 14, 400-406 (2015)). Both approaches are facing challenges with scalability for different reasons.

Example embodiments of the disclosed technology provide a solution to these problems by combining selective area grown (SAG) semiconductors with a superconducting phase, either deposited/grown uniformly on the whole substrate and subsequently removed in specified regions, or deposited/grown in specified regions using lithography masks during deposition/growth. In some example implementations, the selective-area-grown materials leave conducting in-plane oriented nanowires that can be tuned with a side gate, top gate, and/or a bottom gate. Further, in some example implementations, the substrate is insulated to prevent leakage currents.

Figure 1A:
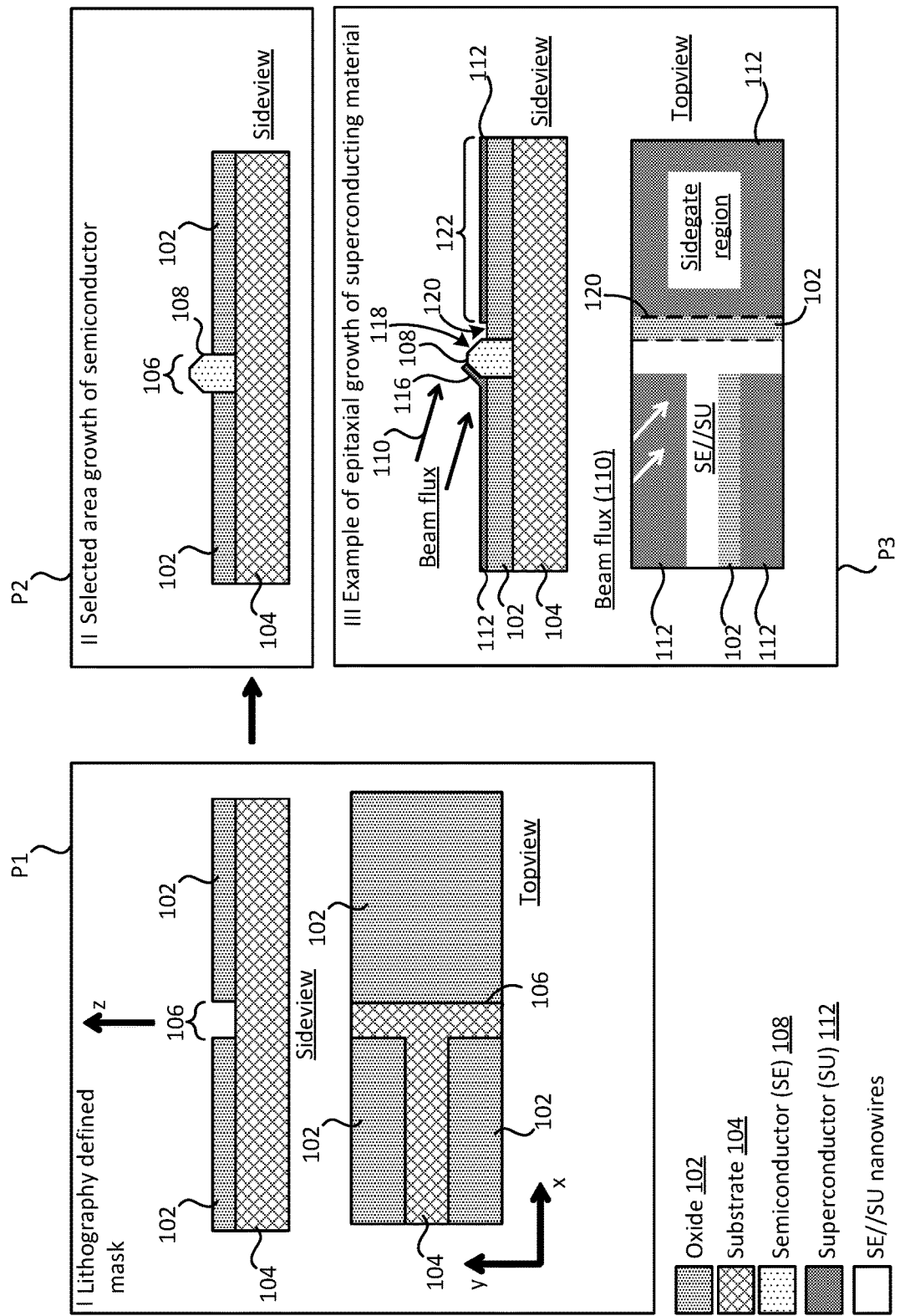
FIGS. 1A and 1B show selected area growth of a lithography defined semi-super conductor nanowire network. Step I shows an insulating substrate 104 with dielectric mask material 102, such as oxide, that prevent material from sticking to the surface between the selective region. The mask may be a lithography defined mask. Step II: selective area growth of semiconductor. Step II: Example of angled deposition of superconductor.
Figure 1B:
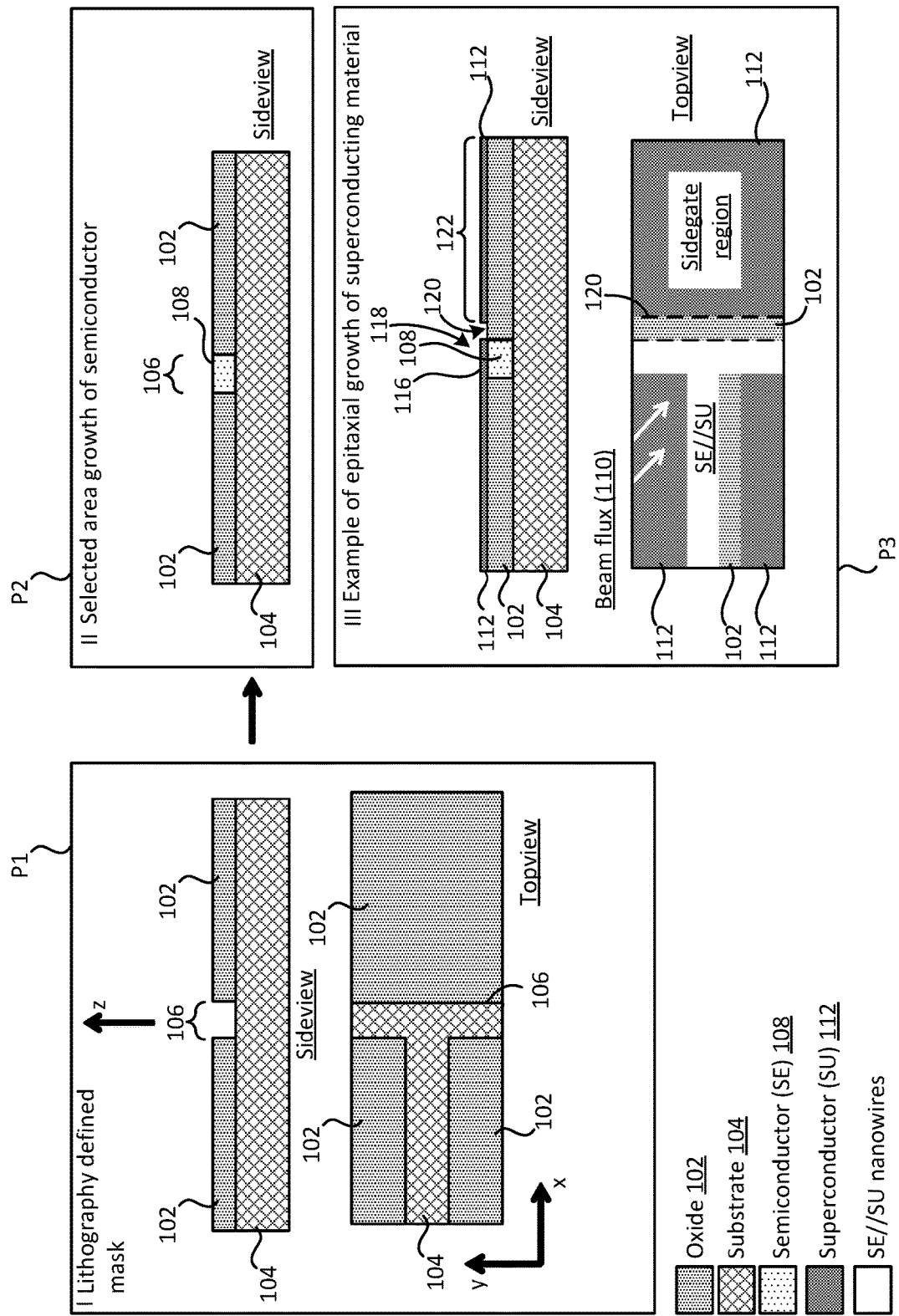

An example of the basic process where the superconductor is deposited as a uniform layer, but where a "shadow" from the selective area grown material is used to form a gap between the semiconductor and the superconductor, is shown in FIG. 1. In this particular case, the superconductor, that does not touch the semiconductor, can be used as a side gate, while the superconductor that are in direct contact with the semiconductor are used to induce superconductivity.

SAG is a growth method using crystal growth vacuum chambers such as, Chemical Beam Epitaxy (CBE), Molecular Beam Epitaxy, and MOCVD. See, e.g., G. J Davies *Proc. SPIE* 2140, Epitaxial Growth Processes, 58 (May 11, 1994); doi:10.1117/12.175795; M Fahed, Doctoral thesis: Selective area growth of in-plane III-V nanostructures using molecular beam epitaxy, 2016. http://www.theses.fr/2016LIL10114; Fukui et al, Appl. Phys. Lett. 58, 2018 (1991); doi: http://dx.doi.org/10.1063/1.105026.

Using SAG as a basis for gatable superconductor network desirably involves an insulated substrate, and that the selective area grown material can carry induced superconductivity.

Figure 2:
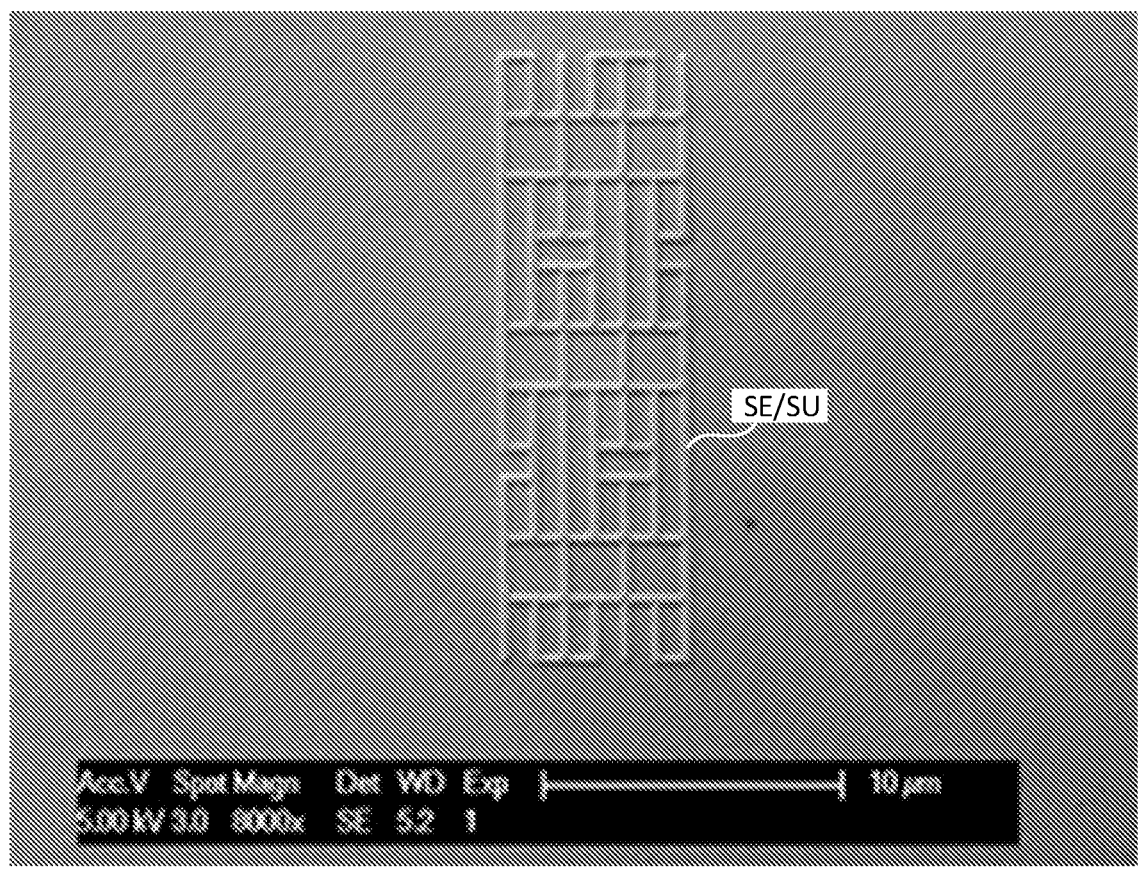
FIG. 2 shows a top view of a selective area grown InAs nanowire network on an InP substrate.
Figure 3:
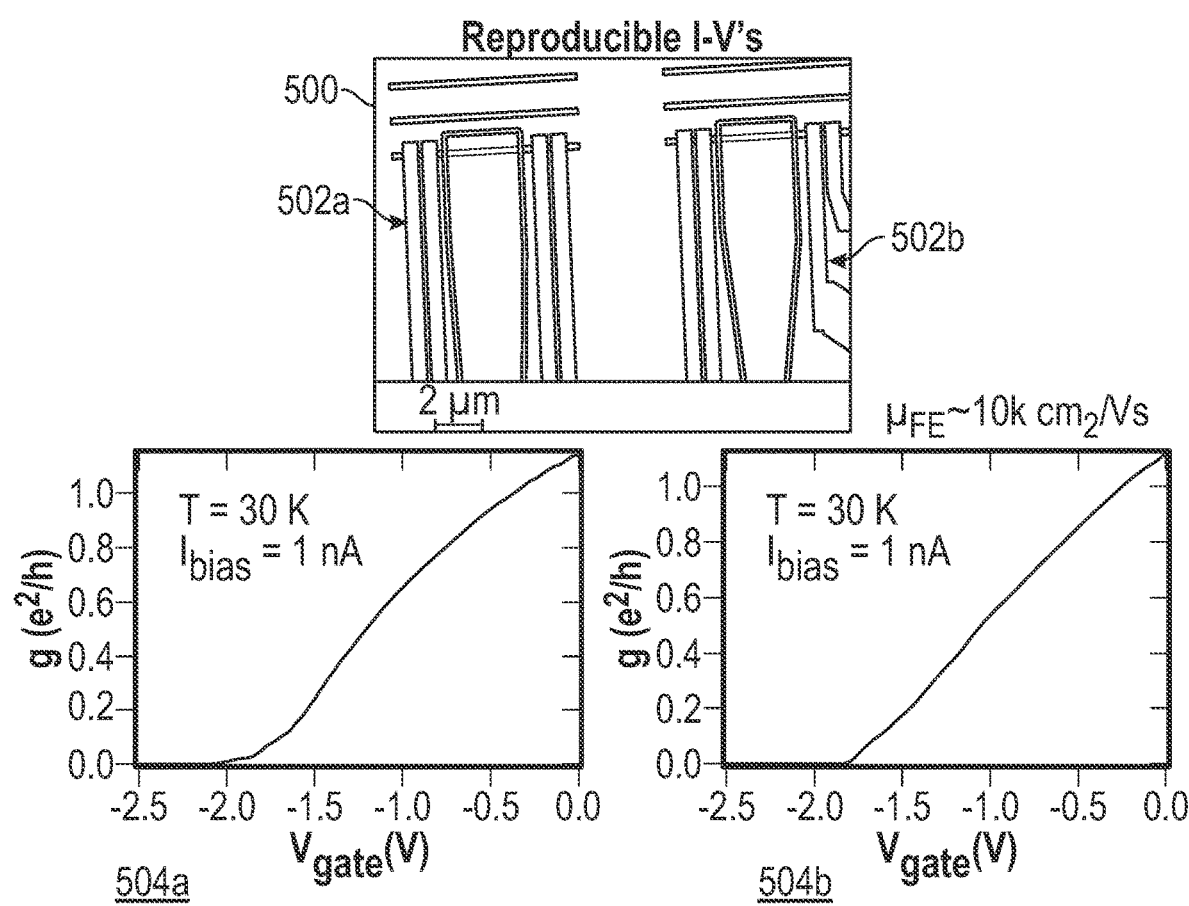
FIG. 3 shows reproducible I-V curves for contacts applied to SAG nanowires. This shows contacts (bright vertical lines) and a top gate (dark vertical line) applied to SAG nanowires (bright horizontal lines). The I-V characteristics show this method offers reproducibility, which is not common in nanowire devices.

Embodiments of the disclosed technology include topologically protected quantum computing circuits that comprise networks of nanowires formed using such mixed semiconductor and superconductor regions. In FIG. 2, for instance, a wire-pattern consisting of InAs nanowires grown on an insulating InP substrate is shown. In particular, FIG. 2 shows the fabrication of a complicated network based on one-dimensional nanowire network. FIG. 3 shows example contacts and gates that can be added using lithography methods.

Further embodiments concern example structures and methods for side gating in selective area growth heterostructures. In particular, FIGS. 4-9 discloses example embodiments for side gating in selective area growth heterostructures. The materials identified in FIGS. 4-9 are not to be construed as limiting, however, as the disclosed structures can be fabricated from a variety of other suitable materials.

As noted, the selective area growth (SAG) of nanowire networks can be used to produce Majorana-based topological qubits, which utilize the formation of superconducting islands, some parts of which are topological (T) and some parts of which are non-topological (e.g., conventional s-wave (S)). SAG techniques can provide a high degree of control over the shape of the produced devices, and thus are useful in producing the components used in scalable topological quantum computation.

In example embodiments, the disclosed technology comprise one or more topological qubits, where Majorana zero modes (MZMs) appear in pairs at the ends of linear T-segments, and where the qubit comes into contact with either a s-wave superconductor or an insulator. In order to operate a topological qubit, and in certain example embodiments, one desirably has electrostatic control over one or more T-segments and can tune the Fermi energy in the segments to the appropriate parameter regime.

Typically, gating in two-dimensional heterostructures is performed with a global back gate. The use of a global back gate, however, has a major drawback in the context of SAG and is not suitable for the construction of complex structures necessary for scalable quantum computing. Embodiments of the disclosed technology as illustrated in FIGS. 4-9 can be used to circumvent this difficulty by introducing a side-gate built into the SAG structure during the same fabrication steps as the topological qubit.

SUMMARY OF FIGS. 4-9

Majorana-based topological qubits use the tuning of nanowire segments into topological regime.

This disclosure explains how to fabricate a local gate in an SAG approach in order to tune segments of nanowires into topological regime.

One of the features of the disclosed technology is the use of an etch technique, similar to the one already used to define the wire, in order to create a trench for the gate nearby each wire.

Gating efficiency depends how buried the gate is relative to the aluminum shell screening electric fields. Multiple example setups are disclosed that would circumvent the difficulty and would optimize gate efficiency.

This present disclosure is not limited to gating the wires into topological regime. The disclosed technology also applies to other SAG devices where local gating is required.

Figure 4:
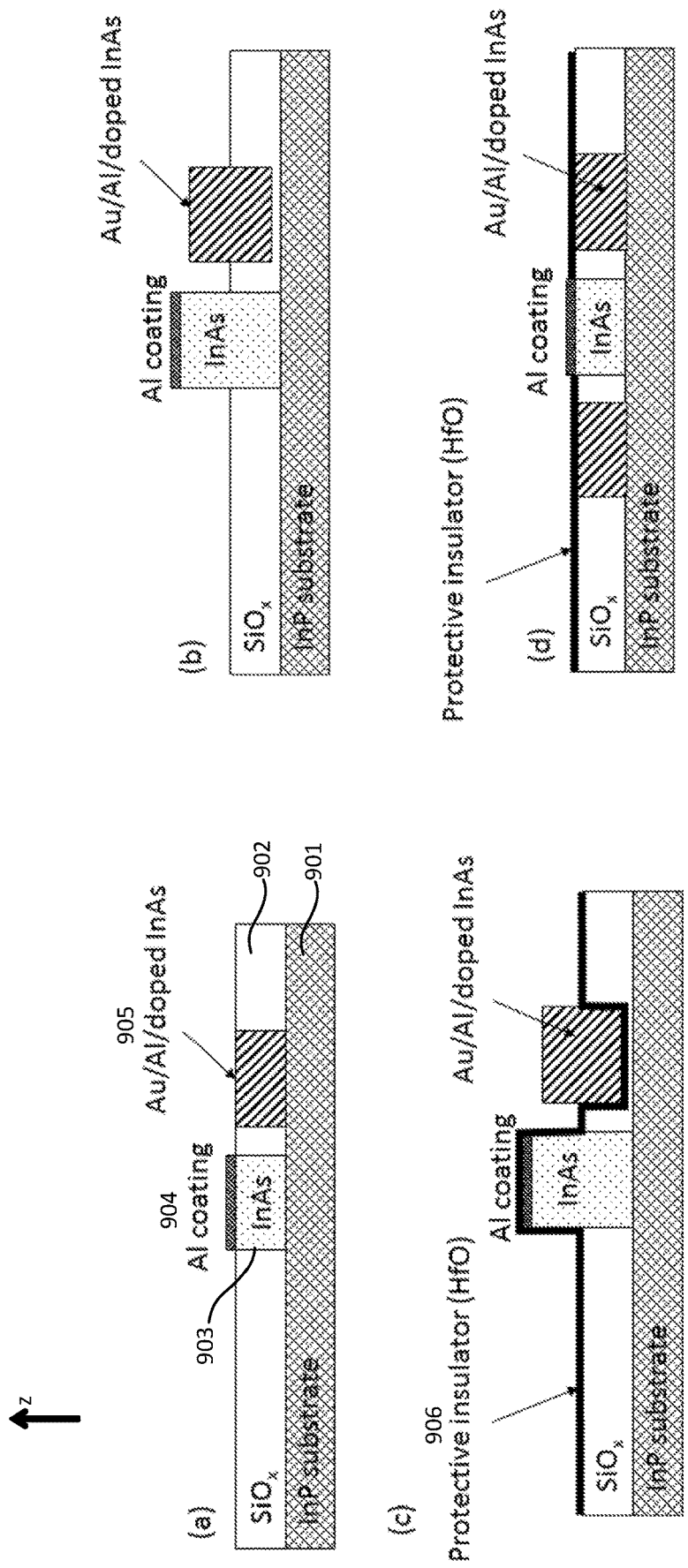
FIG. 4 illustrates cross-section variants for side-gating.

FIG. 4 illustrates cross-section variants for side-gating. Fabrication for the case (d):
1. Make trenches in dielectric ($SiO_x$) for the gates.
2. Deposit metal in the trenches (after a layer of protective insulator in case the gate might be shortened to the InP).
3. Cover everything with a layer of protective insulator (e.g., HfO).
4. Make trenches in the insulator ($SiO_x$) and selectively grow nanowires.
5. Deposit superconductor (aluminum) selectively using mechanical mask or other method. Aluminum in the topological and trivial segments should be deposited simultaneously in order to avoid subgap states.
6. Etch superconductor where needed, and do all the post-processing (e.g., deposit additional gates to control quantum dots).

FIG. 5(i) illustrates a top view (showing the gate and possible connections to outside).

Figure 5:
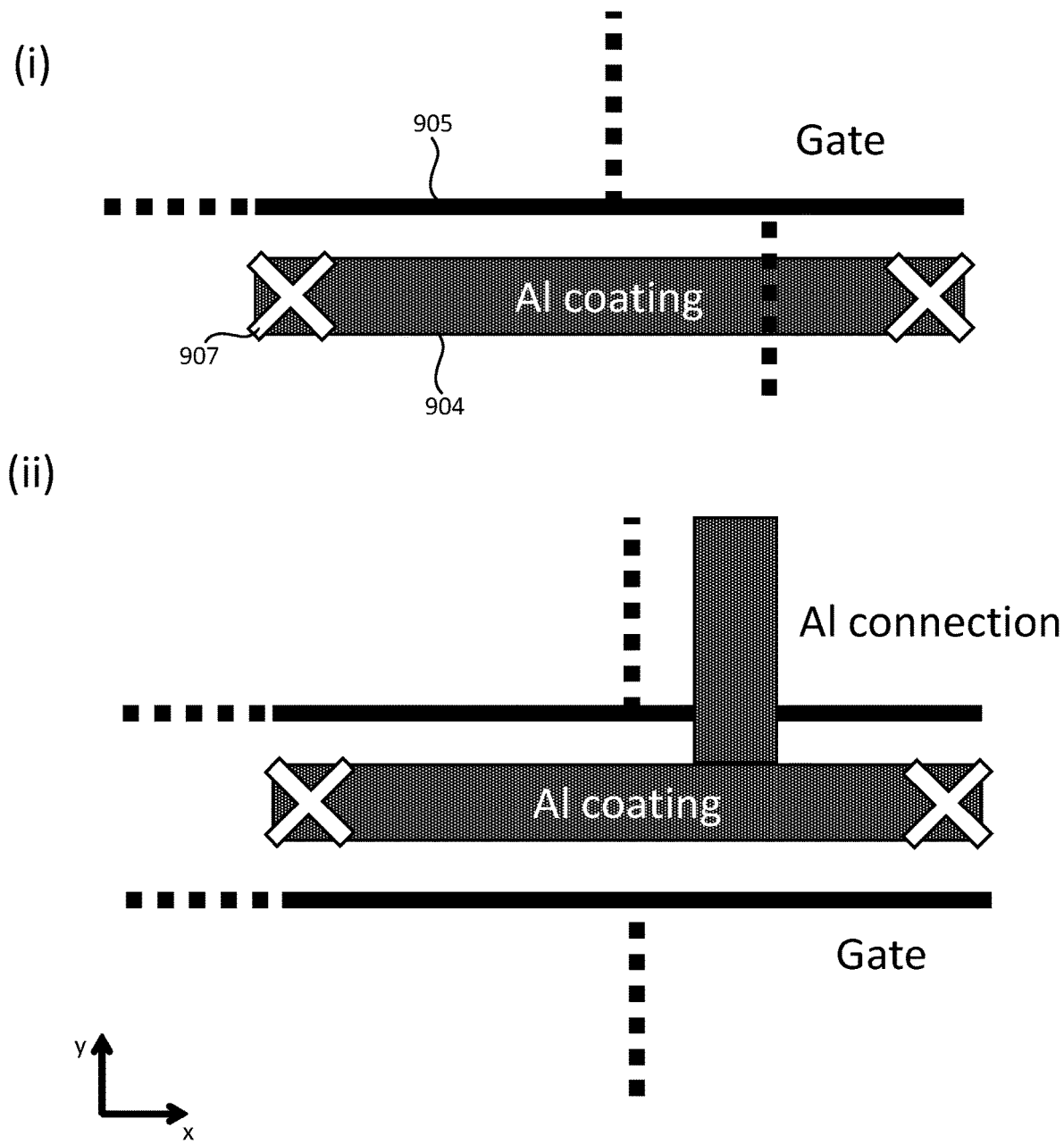
FIG. 5 illustrates a top view of a gate and possible connections to the outside.

FIG. 5(ii) illustrates a top view (for the case of the gates on both sides). Al connection can go above one of the buried gates like in FIG. 9(d).

Figure 6:
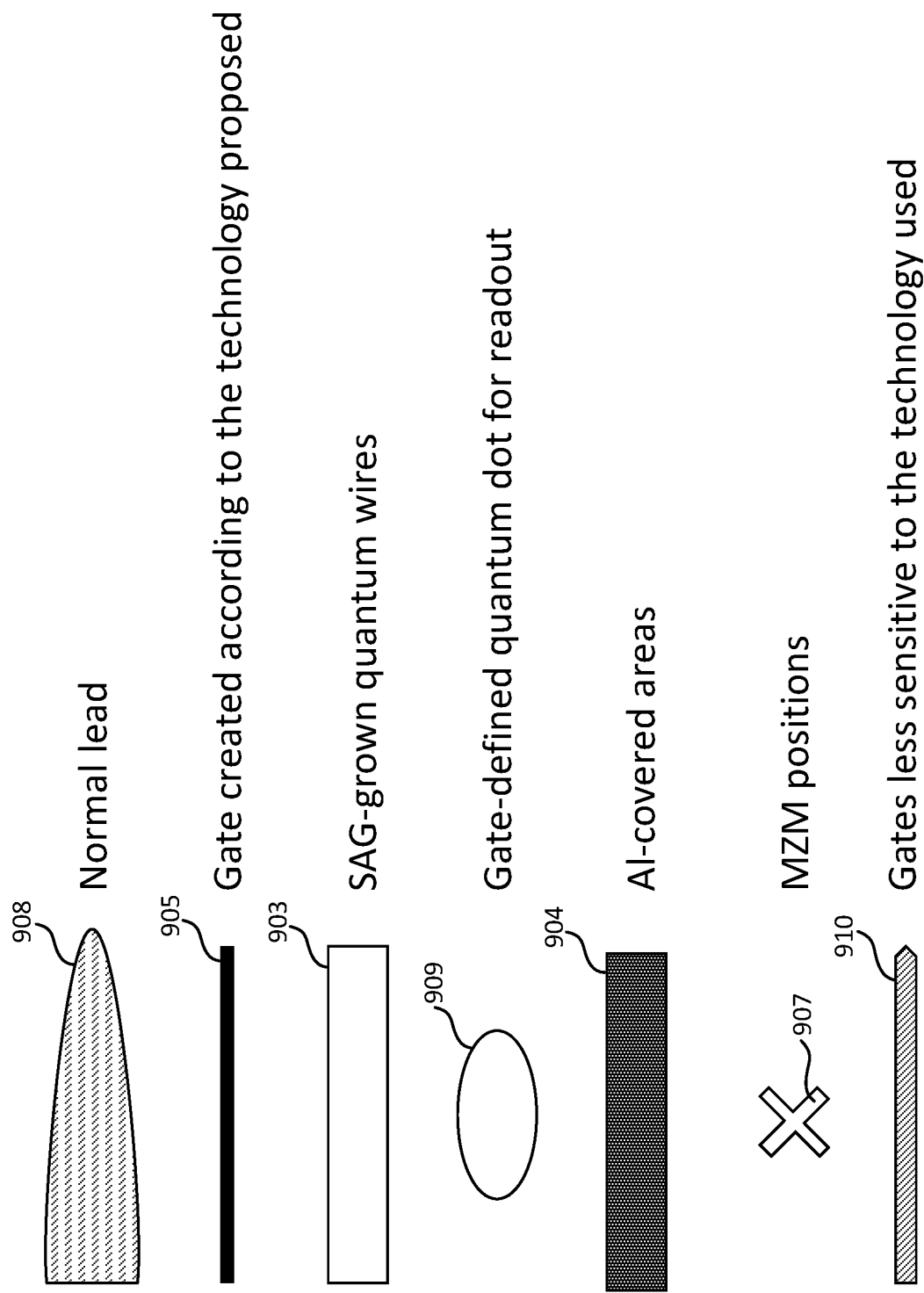
FIG. 6 illustrates notations used in qubit design.

FIG. 6 illustrates notations used in qubit design. Elements 908 show normal leads. Elements 905 show gates created according to the technology disclosed. Elements 903 show SAG-grown quantum wires. Elements 909 show gate defined quantum dots for readout. Elements 904 show Al-covered areas. Elements 907 show MZM positions. Elements 910 show gates less sensitive to the technology used.

Figure 7:
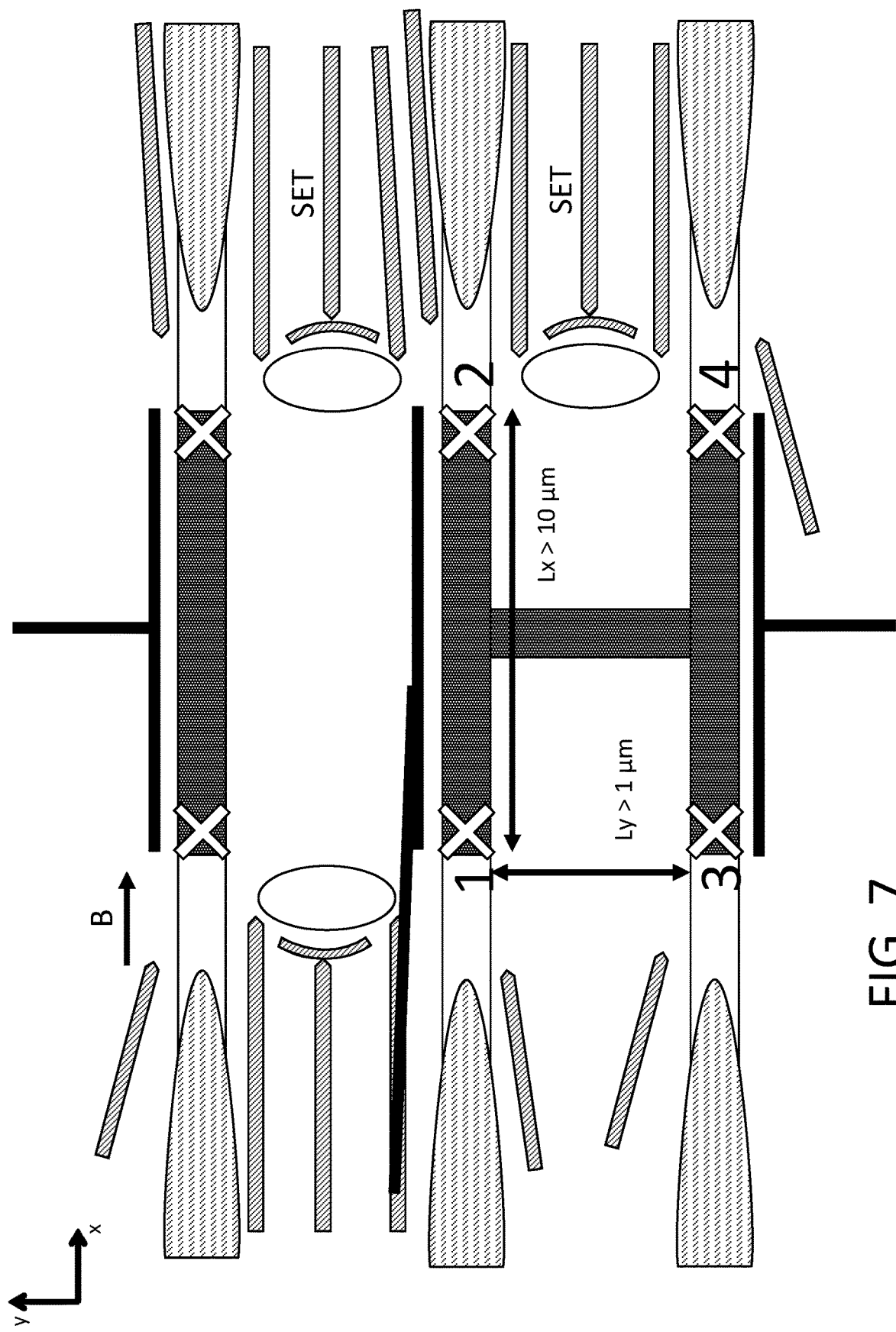
FIG. 7 illustrates a device design for the single topological qubit.

FIG. 7 illustrate a device design for the single topological qubit (InAs nanowire, Al superconductor). This includes a gate configuration to tune the single topological qubit (requiring three gate-tunable topological wires). Such design allows for topologically protected gates along all principle qubit directions.

Figure 8:
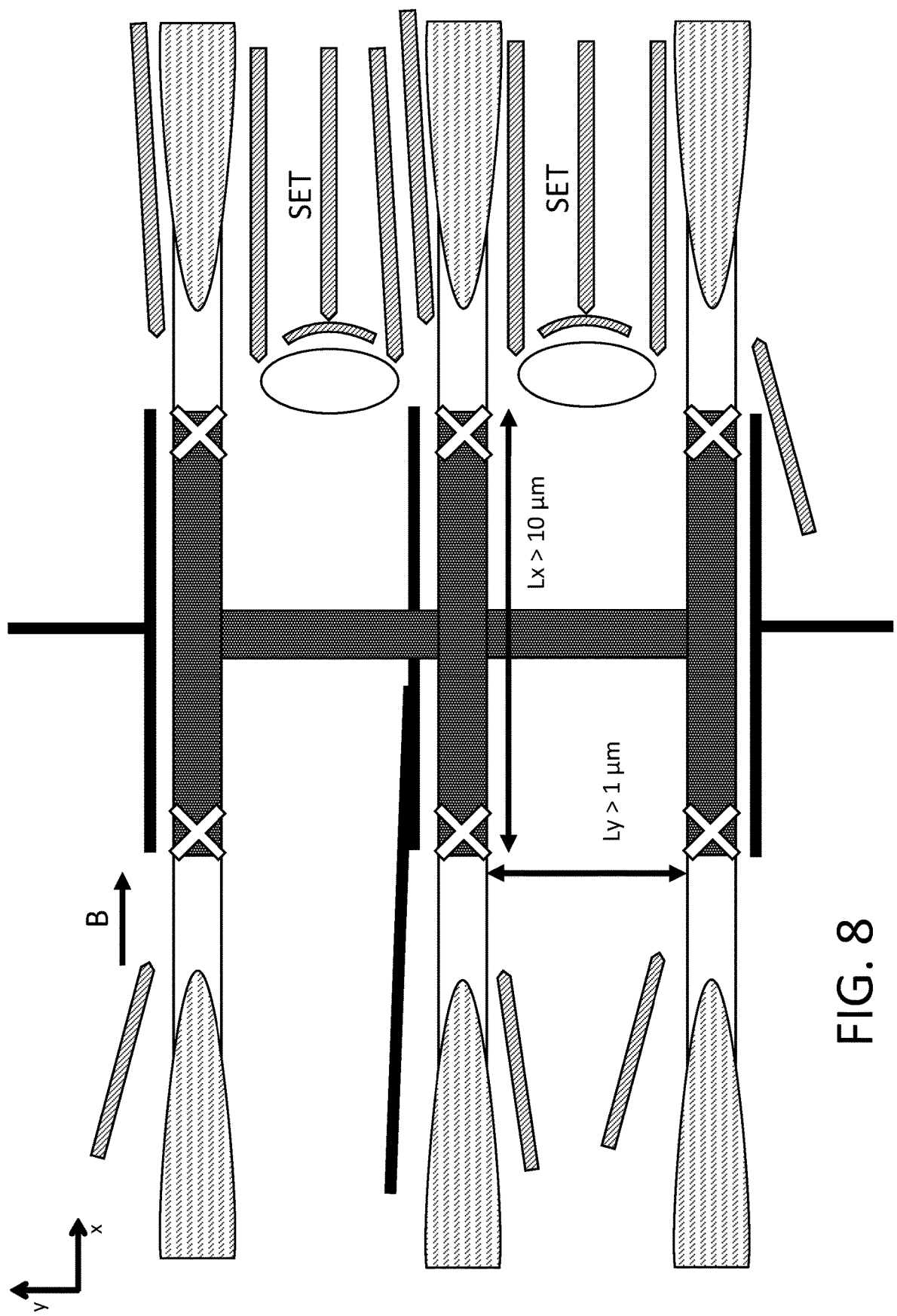
FIG. 8 illustrates a Majorana Hexon design.

FIG. 8 illustrates a Majorana Hexon design. This includes a gate configuration to tune the single hexon qubit (requiring three gate-tunable topological wires). This design requires buried gate to tune the middle topological region like in (d) above. All the designs can be made more tunable by having two gates on the two sides of each topological regions. This increases tenability, but also the number of lines necessary.

Figure 9:
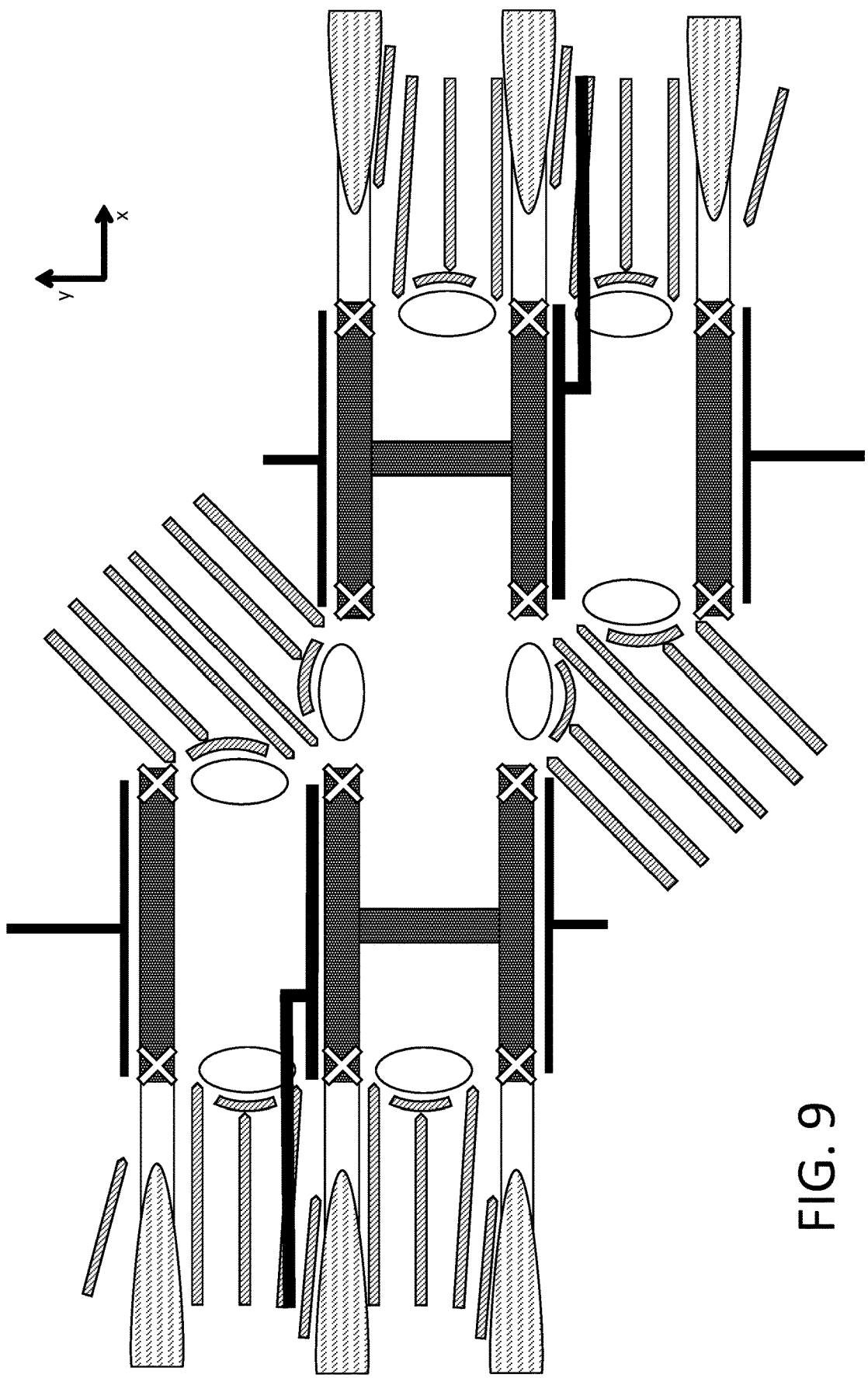
FIG. 9 illustrates a two-qubit design allowing for an entangling gate.

FIG. 9 illustrates a two-qubit device design allowing for an entangling gate. This illustrates design of a two-qubit device using the same technique.

One advantage of the example methods and structures disclosed in FIGS. 4-9 is their versatility and locality. For instance, the compact gate electrode influences only the local electrostatic environment of the targeted region. Further, the depth control of the gate can be optimized so that it does not get screened (or has reduced screening) by the Aluminum shell of a proximitized nanowire.

Example designs for Majorana quad qubits and Majorana hexon qubits that can be realized using the disclosed fabrication and/or gating structures are described in, for example, Karzig et al., "Scalable Designs for Quasiparticle-Poisoning-Protected Topological Quantum Computation with Majorana Zero Modes," arXiv:1610.05289 (March 2017) and T. Karzig et al., "Scalable Designs for Quasiparticle-Poisoning-Protected Topological Quantum Computation with Majorana Zero Modes, "Phys. Rev. B 95, 235305 (2017); U.S. patent application Ser. No. 15/636,457 entitled "QUANTUM COMPUTING METHODS AND DEVICES FOR MAJORANA QUAD QUBITS" and filed on Jun. 28, 2017; U.S. patent application Ser. No. 15/636,376 entitled "QUANTUM COMPUTING DEVICES WITH MAJORANA HEXON QUBITS" and filed on Jun. 28, 2017; U.S. Provisional Application No. 62/382,253, entitled "QUANTUM COMPUTING DEVICES WITH MAJORANA HEXON QUBITS" filed on Aug. 31, 2016; and U.S. Provisional Application No. 62/385,245, entitled "QUANTUM COMPUTING METHODS AND DEVICES FOR MAJO- RANA QUAD QUBITS" filed on Sep. 8, 2016, all of which are incorporated herein by reference in their entirety.

With reference to FIG. 1, an example three-phase fabrication method will now be described. The fabrication method can be used to create a network of SE/SU nanowires, which in turn can form the basis of a quantum circuit (e.g. for a quantum computer) or other mixed semiconductor-superconductor platform. In particular, the method is particularly suitable for fabricating a SE/SU nanowire network capable of hosting stable MZMs, with no or significantly reduced soft gap decoherence, which can form the basis of fault-free topological quantum computations.

Because the SE/SU nanowire network is created using SAG, an entire nanowire network or multiple such networks can be fabricated as a whole on an insulating substrate. The insulating substrate and the nanowire can be incorporated directly into the final product, without any need to transfer the nanowires to a different surface. Thus the method is significantly more scalable than the existing approaches.

In a first phase I (masking phase) a patterned layer of dielectric material 102 (dielectric mask) is formed on top of an insulating substrate 104. A side-view and a top-view of the substrate 104 with the dielectric mask 102 are shown on the left hand side of FIG. 1. The substrate 104 can be formed of any suitable substrate material such as InP (Indium Phosphide), and is an insulating substrate in the described examples. In the described examples, the dielectric material 102 is an oxide but it can be any dielectric material that facilitates SAG in a second phase II of the fabrication method (see below).

The oxide layer 102 is patterned in that the oxide layer 102 is formed so as to leave narrow strips of the substrate—in a desired region 106—exposed (i.e. not covered by the oxide 102). The pattern in this context refers to the structure of the desired region 106, which will ultimately become the structure of the nanowire network, as it is this exposed region 106 in which SE nanowires are grown. Accordingly, the size and structure of the nanowires matches the size and structure of the exposed region 106. Although only one exposed region 106 is shown in FIG. 1, nanowires can be grown simultaneously in multiple regions and all description pertaining to the desired region 106 applies equally to multiple such regions. Accordingly, the structure of an entire nanowire network can be defined by the structure of the exposed region(s). In this example, the strips and hence the resulting nanowires have a width of the order of tens or hundreds of nanometers.

The oxide layer 102 can be formed so as to leave the desired region 106 exposed in any suitable manner. For example, a uniform, continuous layer of a dielectric such as an oxide can be deposited on the substrate 104, and the exposed region 106 can then be formed by selectively etching away the oxide 102 from the desired region 106 (in this case, it is the etching that defines the eventual nanowire network structure). As another example, the oxide layer 102 can be selectively deposited on the substrate 104 with a mask used to prevent deposition of the oxide 102 in the desired regions 106 (in this case, it is the mask that defined the eventual nanowire network structure). The oxide 102 may for example be silicon oxide (SiOx). More generally any suitable dielectric or other insulator could be used.

The SAG nanowires are defined along high symmetry in-plane crystal orientations on the substrate, which also gives well-defined faceting of the nanowires. This makes the SU/SE interface flat, potentially atomically flat, and well defined.

In the second phase II, namely the SAG phase, a semiconductor material 108 is selectively grown within the desired regions 106, on top of the exposed portion of the substrate 104. An example is illustrated at the top right of FIG. 1, at which a side-view of the substrate 104 is shown. Due to the patterning of the oxide layer 102, the selectively grown semiconductor 108 forms in-plane nanowires (that is, nanowires lying in the place of the substrate 104). The semiconductor material 108 may for example be Indium Arsenide (InAs), Indium Antimonide (InSb), or any other semiconductor with relatively large spin orbit and G-factor.

SAG is a growth method using crystal growth vacuum chambers. SAG refers to localized growth of semiconductor in exposed regions of the substrate, with growth conditions selected to prevent such growth on the dielectric mask itself. This can be based on Chemical Beam Epitaxy (CBE), Molecular Beam Epitaxy (MBE), or Metal-Organic Chemical Vapour Deposition (MOCVD), for example. In the context of semiconductors, SAG refers to a particular class of epitaxial semiconductor growth (and is also referred to as selective area epitaxy), in which a patterned dielectric mask is used to define the intended structure of the semiconductor material to be grown (a form of lithography). The SAG process is tuned such that semiconductor growth occurs only on regions of the substrate that are not covered by the dielectric mask 102, and not on the dielectric mask itself. This is different from other deposition/growth processes, such as bottom up growth (in which no mask is used) and uniform deposition (epitaxial or otherwise) in which material is uniformly deposited across a surface irrespective its material composition (as in phase III—see below). SAG is conducted in a high or ultra-high vacuum, and requires careful tuning to achieve the desired selective semiconductor growth.

Any suitable SAG process can be used in the second phase II to create the desired SE nanowires in the exposed region 106.

SAG per-se is known, and is therefore not discussed in further detail herein. For further description of SAG, see for example the above-cited references by G. J. Davies, M Fahed, and Fukui et al.

Suffice it to say that the SAG phase II is such that, at the end of that phase, the semiconductor material 108 fills the desired region 106 (that is, the region 106 in which the substrate 104 is not covered by the oxide mask 102) but does not extend, in the plane of the substrate 104 (xy-plane hereafter), beyond the boundaries of the desired region 106 as defined the oxide layer 102. In some cases it may extend outwardly in a direction normal (perpendicular) to the plane of the substrate 104 (z-direction hereafter) so as to protrude outwardly of the oxide mask 102. That is, the semiconductor material 108 extends a greater distance from the substrate 104 than the oxide layer 102 in the z-direction. In this manner, the semiconductor material 108 forms nanowires lying substantially in the plane of the substrate 102 (in-place nanowires).

The semiconductor material 108 can be any suitable semiconductor material, such as Indium arsenide (InAs). The SAG semiconductor 108 can for example be confined 2 DEG (two-dimensional electron gas) semiconductor or single material semiconductor.

In a third phase III (superconductor growth phase) a layer of superconducting material 112 is grown, e.g. using a particle beam 110. Herein, a superconducting material means a material that exhibits superconducting properties at least under certain conditions. An example of such a material is aluminum (Al). Alternatively the superconductor material 112 could be niobium (Nb), titanium nitride (TiN), or any other s-wave superconductor. In the following examples, the superconductor is grown epitaxially in phase III, and the superconductor growth phase III may be referred to as an epitaxial growth phase in this context. However, the technology is not limited in this respect, and it may be possible to achieve the intended result via non-epitaxial superconductor growth in phase III.

The superconducting material 112 can be grown in phase III using molecular beam epitaxy (MBE) electron gun epitaxy, for example.

At least part of the superconductor layer 112 is deposited on top of the SE nanowire core 108 such that this part of the superconductor layer 112 (labelled 116 in FIG. 1) is in direct contact with the SE 108 of the nanowire. That is, such that the semiconductor 108 of the nanowire is at least partially covered with superconducting material.

This is also a form of epitaxy, but it is not SAG. In particular, in the epitaxial growth phase III, epitaxial growth does occur on the dielectric layer 102, as well as on the SE 108 of the nanowires.

In one possible technique, the beam can be angled in substantially the z-direction (the direction perpendicular to the plane of the substrate) such that essentially all of the exposed surfaces of the dielectric layer 102 and the SE material 108 are covered by the SU layer 112. However, in another example as illustrated, the particle beam 110 is incident on the substrate 104 with a non-zero angle of incidence relative to the z-direction (deposition angle). As a consequence of this non-zero deposition angle and the protruding structure of the SE core 108 of the nanowire, the SE of the nanowire is only partially coated by the superconductor layer 112; that is, a part of the SE nanowire core (labelled 118) is not coated by the superconductor material. The bulk of the dielectric layer 102 is also coated by the superconductor layer 112, however due to the angle of the incoming beam 110 and the protruding structure of the SE nanowire cores 108, small regions of the dielectric layer 102 (shadow regions) immediately adjacent the protruding SE nanowires 108 are left exposed, i.e. not coated by the SU material. One such shadow region is labelled 120 in FIG. 1. The shadow region 120 separates the SE material 108 from a portion of the SU layer 112 in a "side gate" region 122. The portion of the SU layer 112 in the sidegate region 122 can be used to form a gate for controlling the nanowires, or (more likely) the SU material can be etched away from this region and replaced with a more suitable gate material, as in the example below. Either way, the shadow gap 120 ensures the gate operates as intended. Forming the gap 120 using such "in-situ" patterning in the SU epitaxy phase P3 (as described above) ensures that material does not need to be etched away too close to the delicate nanowires 108.

This is an example of the basic process where the superconductor is deposited as a uniform layer, but where a "shadow" from the selective area grown material is used to form a gap between the semiconductor and the superconductor. In this particular case, the superconductor, that does not touch the semiconductor, can be used as a side gate or etched away and replaced with a more suitable gate material, while the superconductor that are in direct contact with the semiconductor are used to induce superconductivity.

The bottom right of FIG. 1 shows both a side-view and a top-view of the substrate 104 at the end of the third phase III. Note that, in the top-view, the part 116 of the superconductor layer 112 that partially coats the SE nanowire core 108 is not distinguished from the uncoated part 118 of the SE 108 of the nanowires; rather the combined nanowire structure formed of the SE nanowire cores 108 and the portion of the superconductor material 116 that (partially) covers the SE cores 108 (i.e. that is in direct contact therewith) is depicted as a single element, labelled SE//SU. This combined structure is similarly represented and labelled in later figures, and herein references to "SE/SU nanowires" or "SE//SU nanowires" refer to the SE nanowire cores 108 and the SU material 116 that (partially) covers them.

The SAG phase II and superconductor growth phase III can be conducted in a vacuum chamber, preferably without moving the substrate 104 between phases. These phases can be carried out under high vacuum or ultra-high vacuum conditions (~10-8–10-12 Torr or less), and those vacuum conditions may be maintained between phases. Among other things, this ensures a clean SE/SU interface, free from unwanted impurities.

Both the SAG semiconductor growth of phase II and the superconductor growth of phase III require carefully calibrated conditions to get within respective "growth windows" for these two phases, and thereby achieve the desired semiconductor and superconductor growth respectively. The growth conditions, temperature and flux are chosen dependent on the material type. For example, for MBE (which can be used in both the semiconductor SAG phase II and superconductor growth phase III), the substrate is generally heated to temperatures of around 500° C. or more to clean the surface for native oxide. However, in the SE SAG growth phase II and SU growth phase III, the respective temperature windows in which the desired growth takes place is dependent on the composition of the SE material 108 and SU material 112 respectively. The superconductor may be grown/deposited in-situ, without breaking vacuum. In this way the surface of SAG is not oxidized in air and remain clean until the SU is put on, which ensure a clean SE-SU interface.

Using SAG as a basis for gatable superconductor network desirably involves an insulating substrate, and that the selective area grown material can carry induced superconductivity.

The substrate 104 and oxide layer 102 on which the SE//SU nanowire network is grown can be incorporated in the end-product, such as a quantum circuit or quantum computer, along with the SE/SU nanowire network, without transferring the nanowires from the substrate on which they were originally fabricated.

Embodiments of the disclosed technology include topologically protected quantum computing circuits that comprise networks of nanowires formed using such mixed semiconductor and superconductor regions.

In FIG. 3, for instance, a wire-pattern consisting of InAs nanowires grown on an insulating InP substrate is shown. In particular, FIG. 3 shows the fabrication of a complicated network based on one-dimensional nanowire network. The network is a SAG InAs nanowire network formed on an InP substrate.

FIG. 2 shows a top-view image 500 of two matching, side-by-side example SE/SU nanowire structures 502a, 502b, fabricated according to the described method. Here, contacts (bright vertical lines) and top-gates (dark vertical line) can be seen applied to SAG nanowires (bright horizontal lines). These can be added using lithography methods, for example.

FIG. 2 also shows respective I-V (current-voltage) graphs 504a, 504b for the matching structures 502a, 502b respectively. As can be seen, the two SE/SU nanowire structures 502a, 502b exhibit very similar I-V characteristics. This demonstrates one of the benefits of the fabrication method, namely reproducibility, i.e. the ability to produce nanowire structures with consistent physical characteristics.

The topological segments are tuned into the topological regime by the gates. Once tuned they enable operation of the nanowire network as a qubit.

Conventionally a side gate would have been formed "out of plane"; that is to say, above the level of the superconductor 112 in the z-direction, in the side-gating region 122 (so diagonally up and to the side). Furthermore, it is not always the case that the semiconductor 108 of the nanowire extends outwardly in a direction normal (perpendicular) to the plane of the substrate 104 (z-direction hereafter) so as to protrude outwardly of the oxide mask 102. For example this may not be possible or practical for design reasons. See FIG. 1A by way of contrast with FIG. 1 (where in FIG. 1A the gap 120 may be either deposited uniformly on the whole substrate and subsequently removed in specified regions, or deposited in specified regions using lithography masks during deposition, rather than being formed in the shadow of the protruding nanowire SE 108 as discussed previously).

Such an arrangement is inefficient since it does not allow for the best electrostatic coupling between the side-gate and the main body of the semiconductor 108 in the nanowire. Particularly, the superconductor in the superconductor layer 112 will act to shield the main body of semiconductor 108 in the nanowire from the electric field radiated by a side gate formed higher up in the side-gate region 122.

Gating of a nanowire comprises applying an electrostatic potential (i.e. voltage) to the semiconductor part 108 of the nanowire. This is described briefly with reference to FIG. 10, but can be read about in more detail in "Effects of gate-induced electric fields on semiconductor Majorana nanowires", Andrey E Antipov et al, 8 Jan. 2018, https://arxiv.org/pdf/1801.02616.pdf.

Figure 10:
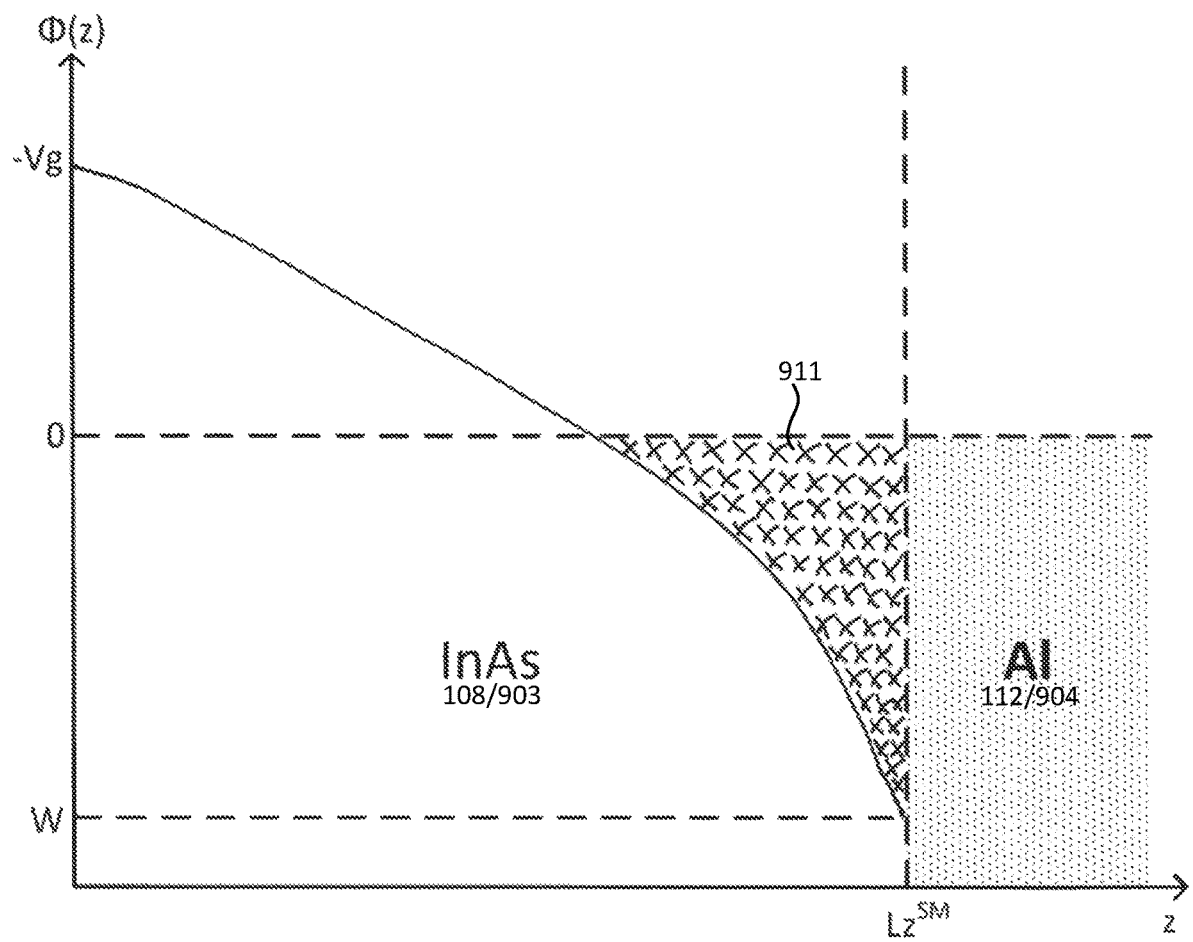
FIG. 10 is a sketch of electrostatic potential as a function of vertical position z in a semiconductor-superconductor nanowire.

FIG. 10 shows the electrostatic profile within a semiconductor-superconductor nanowire. The vertical axis represents electrical potential, and the horizontal axis represents distance in the z direction from the bottom of the semiconductor 108 (direction perpendicular to the plane of the substrate 104) in a one-dimensional cross section through the wire. The vertical position z=0 represents the bottom of the nanowire and $z=L_z^{SM}$ represents the top of the semiconductor of the nanowire, i.e. the height of the interface between the semiconductor 108 and superconductor 112 in the 1D cross-section in question (e.g. mid way through the width of the wire, or at its maximum height).φ(z) shows the potential inside the wire at vertical displacement z in this cross section, as a function of z. (Note it is assumed herein that relative orientations such as "above" and such like are defined relative to the substrate 104 as the relative base, not necessarily with respect to gravity).

A voltage Vg is applied by an external source to the side gate in region 122, thus bringing the gate to potential Vg. When the gate is set to +Vg, then the potential at the bottom of the wire is −Vg. Electric field lines could from the side gate to the semiconductor 108 in the nanowire. As a result, the potential at z=0 (bottom of the wire) is set by the gate voltage Vg. It is equal to the gate voltage when the gate touches the semiconductor and is smaller than it when the gate is further away or the arrangement is geometrically unfavorable. Note that in general the gate voltage could be positive or negative. At the interface between the semiconductor and the superconductor, $z=L_z^{SM}$, the potential is given by the band offset W. W is also independent of the applied gate voltage. Thus the total offset $W+V_g$ varies as a function of the applied gate voltage, as does the area of the shaded region 911 shown in FIG. 10 (the area bounded by the curve, the line $z=L_z^{SM}$, the line φ=0, and the line φ=W).

This region 911 is where the density of electron states accumulates. To operate a qubit, it is desired to be able to control the offset of the line $V_g$ in FIG. 10—i.e. to control the offset in potential of the electrostatic potential curve. For instance it may be required to tune this level $V_g$ in order to bring the nanowire into the topological regime. The inducement of MZMs for the purpose of creating a topological qubit depends on creating the right density of electrons around the semiconductor-superconductor interface 108/112. Due to the geometry of the field lines from the gate to the superconductor, the effective length from the gate to the superconductor varies. This phenomenon in itself is understood in the art. E.g. refer to the cited reference by Antipov et al.

FIG. 10 represents an idealized scenario where the potential Vg applied at the side gate is fully transferred to the semiconductor of the nanowire.

However, an issue addressed herein is that the efficiency with which one can control the height of the offset $V_g$ (the offset in the electrostatic potential curve) depends on the electrostatic coupling between the side gate and the semiconductor 108 of the nanowire. Efficiency here refers to the ratio of the potential applied at the gate to the potential at the base of the nanowire. If the side gate is formed in the region 122 in the layer above the main body of the nanowire, then some of the electric field lines emanating from the side gate will terminate at the layer superconductor 112 (e.g. Al), thus shielding the effect of the gate. Thus the applied electrostatic potential cannot be efficiently transferred from the side gate to the semiconductor 108 of the nanowire.

To address the above issue or similar, the present disclosure provides a structure and corresponding fabrication process whereby the side gate is buried in the layer as the semiconductor of the nanowires. Some example implementations of this are illustrated in FIGS. 4(a) to 4(d).

In FIG. 4 (and subsequent figures), the substrate 901 may correspond to the substrate 104 described earlier with reference to FIG. 1. The dielectric 902 may correspond to the dielectric layer 102 described earlier with reference to FIG. 1 (but with additional trenches for the side gates). The semiconductor 903 and superconductor 904 may correspond, respectively, to the semiconductor 108 and superconductor 112 described earlier in relation to FIG. 1. The fabrication processes used may be the same as discussed earlier with reference to FIG. 1, except with the formation of additional channels or trenches in the dielectric layer (e.g. mask) 102/902 and the embedding of the side gate(s) 905 in these additional trenches.

The substrate 901 (or 104) defines a plane x, y (the plane upon which the other materials are formed). The z direction is the direction perpendicular to this plane. This defines the "up" direction for the present purposes (so terms such as "over", "above" or such like are defined in terms of this z axis, which in general may or may not be antiparallel to the direction of gravity, depending on the particular fabrication process). Preferably the substrate 901 is an insulator such as InP, since in embodiments the grown semiconductor comes into electrical contact with the substrate. InP is insulator for the present purposes, since it is small energies that are of interest.

In the process of FIG. 4(a), an insulating mask layer (e.g. dielectric mask) 902 is formed over the substrate 901. The mask 902 is then etched to form trenches in the mask 901 (i.e. pits, depressions). The pattern of these trenches define a first set of trenches defining the shape of the network of nanowires, and a second set of one or more trenches defining the shape of a respective one or more side gates 905 associated with the network of nanowires. Each of the second trenches is adjacent to, but not continuous with, one of the first trenches in the network (i.e. there is a portion of the dielectric 902 between them). The first and second trenches may be etched all the way down through the mask 902 to the substrate 901 beneath. In a subsequent fabrication phase, the semiconductor material 903 of the nanowires (e.g. InAS or InSb) is formed by selective-area-growth (SAG) in the trenches defined by the mask 902. Further, the material of the side gates 905 is deposited in the trenches. The side gate material 905 may be a semiconductor such as InAs or InSb, or a semiconductor doped with a conductor or superconductor (e.g. Al or Au). In some embodiments the side gates 905 may be formed from the same material as the semiconductor 903 of the nanowires. In embodiments, the material of the semiconductor 905 may be grown in the same SAG step as the semiconductor 903 of the nanowires. However this is not essential and more generally they can be deposited either in the same step or in a separate step. If in the same step, then the material must be the same. FIG. 4 shows a case when this is done in two separate steps.

Finally the superconductor coating 904 is formed over the semiconductor 903 of the nanowires. This may be by selectively depositing the superconductor 904 through another mask (not shown), or by coating the superconductor across the whole arrangement so far and then etching away unwanted portions.

Thus there is formed an arrangement of semiconductor-superconductor nanowires 903, 904 in the form of a 2D network in the plane of the substrate 901, as defined by the network of first trenches. The network is designed to be operable as a qubit. At least one side gate 905 per qubit network is embedded in the dielectric 902 (in a second trench) such the side gate it is located next to the semiconductor 903 of one of the nanowires, but not actually touching any part of any of the nanowires. Next to, or adjacent, in this context means near enough that when an operating potential is applied to the side gate 905 from an external source, the electrostatic field radiated by the side gate is sufficient to induce topological behavior in the adjacent nanowire. According to the present disclosure, the gate 905 is buried in the dielectric layer 902, below the level of the superconductor 904. Hence the electric field emanating from the gate 905 is not shielded from influencing the semiconductor 903 of the nanowire by any of the superconductor layer 904.

FIGS. 5 to 9 illustrate top-down views (in the x-y plane) of some example applications of the disclosed techniques and structures. FIG. 5(*i*) shows a gate 905 and the routes of possible connections to the outside, by which the gate potential may be applied to the gate 905. FIG. 5(*ii*) shows a similar view for the case of a gate 905 on both sides of the nanowire. This also shows that a superconductor bridge (i.e. interconnection) to another nanowire can be formed in the supercenter layer 904, over the top of one of the buried gates 905. FIG. 7 shows some wider context in the form of the design for a single topological qubit. FIG. 8 shows a Majorana hexon design. FIG. 9 shows a two-qubit device design allowing for an entangling gate.

The plan layouts of the designs shown in FIGS. 5 to 9 in themselves are known. However, in accordance with the teachings disclosed herein, at least one of the side gates 905 per design may be embedded downward in the z direction in the manner described above. Where multiple side gates 905 are required, each of one, some or preferably all of these may be formed in respective second trenches in the dielectric layer in the manner described above (and any others not formed in this manner may instead be formed in the more conventional "out of plane" manner, though preferably it would be desired to form all side gates 905 in the manner disclosed herein).

The fabricated device as a whole may comprise a quantum circuit or quantum computer comprising multiple qubits, each formed using the process described above. In this case, each of multiple networks of first trenches is formed in the same etching step, each corresponding to the design for a respective nanowire network for forming a respective qubit. The semiconductor 903 of the multiple qubits may be deposited in the same SAG step. The side gates 905 of the multiple qubits may also be deposited in the same step as one another, and in embodiments in the same SAG step as the semiconductor 903. The superconducting coatings of the multiple qubits may be formed in the same semiconductor disposition step (or etching step) as one another.

In variants of the process described in relation to FIG. 4(*a*), it is not excluded that the regions of semiconductor 903, side gates 905 and/or superconductor 903 are formed first, and then the dielectric or other insulating material 902 is subsequently formed around them.

FIG. 4(*b*) illustrates further alternative or additional possible variants to the structure and process of FIG. 4(*b*). Here the side gate 905 is not buried all the way down to the substrate 901. Alternatively or additionally, a part of the semiconductor 903 and/or a part of the side gate 905 may extend above the dielectric layer 902; but at least part of each is still buried. In all such embodiments, at least part of the side gate 905 (and at least part of the semiconductor 903) still falls below the superconductor layer 904. For example in the case shown in FIG. 4(*b*), the top of the semiconductor 903, on which the superconductor 904 is coated, is higher than the top of the gate 905 so that all the side gate 905 falls below the superconductor 904.

FIG. 4(*c*) shows another alternative or additional feature. Here, a protective insulator 906 is formed over the dielectric layer 902, the semiconductor 903 and the superconductor 904; but underneath the side gates 905. It protects the material of the nanowire and the superconductor 903, 904 from accidentally coming into contact with the gate material 905 deposited later. In this case the side gate is formed in a subsequent step to the coating with the superconductor 904 and then the protective insulator 906. The protective insulator 906 may for example be Hafnium Oxide (HfO) or any other suitable insulator.

FIG. 4(*d*) shows another possible variant of this. Here, the protective insulator 906 is formed over the dielectric 902 and the side gates 905, but not the semiconductor 903 nor the superconductor 904.

General Considerations

The disclosed methods, apparatus, and systems should not be construed as limiting in any way. Instead, the present disclosure is directed toward all novel and nonobvious features and aspects of the various disclosed embodiments, alone or in various combinations and subcombinations with one another. Furthermore, any features or aspects of the disclosed embodiments can be used in various combinations and subcombinations with one another. For example, one or more method acts from one embodiment can be used with one or more method acts from another embodiment and vice versa. The disclosed methods, apparatus, and systems are not limited to any specific aspect or feature or combination thereof, nor do the disclosed embodiments require that any one or more specific advantages be present or problems be solved.

Various alternatives to the examples described herein are possible. The various aspects of the disclosed technology can be used in combination or separately. Different embodiments use one or more of the described innovations. Some of the innovations described herein address one or more of the problems noted in the background. Typically, a given technique/tool does not solve all such problems.

As used in this application and in the claims, the singular forms "a," "an," and "the" include the plural forms unless the context clearly dictates otherwise. Additionally, the term "includes" means "comprises." Further, as used herein, the term "and/or" means any one item or combination of any items in the phrase.

The disclosed methods, apparatus, and systems should not be construed as limiting in any way. Instead, the present disclosure is directed toward all novel and nonobvious features and aspects of the various disclosed embodiments, alone and in various combinations and sub combinations with one another. The disclosed methods, apparatus, and systems are not limited to any specific aspect or feature or combination thereof, nor do the disclosed embodiments require that any one or more specific advantages be present or problems be solved.

The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology.

More generally, according to one aspect disclosed herein, there may be method for fabricating a quantum device using any of the new and nonobvious methods or method acts described herein both alone or in combinations and subcombinations with one another. According to another aspect disclosed herein, there may be provided any new and nonobvious aspects of the disclosed technology performed as method acts both alone and in combinations and subcombinations with one another. According to another aspect disclosed herein, there may be provided any new and nonobvious aspects of the disclosed technology used in a quantum circuit or quantum computer both alone and in combinations and subcombinations with one another. According to another aspect there may be provided a quantum device comprising any of the new and nonobvious components described herein both alone or in combinations and subcombinations with one another. According to another aspect there may be provided a side gate for controlling a topological segment of a qubit comprising any of the new and nonobvious components described herein both alone or in combinations and subcombinations with one another. According to another aspect there may be provided a method for fabricating a side gate for controlling a topological segment of a qubit comprising any of the new and nonobvious method acts described herein both alone or in combinations and subcombinations with one another. According to another aspect there may be provided a method for operating a quantum device by electrically controlling one or more side gates comprising any of the new and nonobvious techniques described herein both alone or in combinations and subcombinations with one another.

The scope of the present disclosure is not limited by the above-described embodiments but only by the appendant claims.

The invention claimed is:

1. A method for fabricating a quantum device, the method comprising:
providing a substrate and an insulator formed on the substrate;
from combinations of selective-area-grown semiconductor material along with regions of a superconducting material, forming a network of nanowires oriented in a plane of the substrate that is gateable to produce a Majorana-based topological qubit; and
fabricating a side gate for controlling a topological segment of the Majorana-based topological qubit;
wherein the selective-area-grown semiconductor material is grown on the substrate by etching trenches in the insulator formed on the substrate to define the nanowires and depositing the semiconductor material in the trenches defining the nanowires; and
wherein the fabricating of the side gate comprises etching the insulator to create a trench for the side gate and depositing the side gate in the trench for the side gate.

2. The method of claim 1, wherein the side gate is fabricated from one of the regions of selective area grown semiconductor.

3. The method of claim 2, wherein the side gate is formed in the same fabrication steps as the network of nanowires.

4. The method of claim 1, wherein the regions of superconducting material include regions coated on the semiconductor material that is deposited in the trenches defining the nanowires.

5. The method of claim 1, wherein the regions of superconductor are deposited simultaneously using a mechanical mask.

6. The method of claim 1, wherein the insulator formed on the substrate is a dielectric.

7. The method of claim 1, further comprising covering the insulator formed on the substrate and the side gates with a further, protective insulating layer.

8. The method of claim 1, wherein the substrate is an insulating material.

9. The method of claim 1, wherein the regions of superconducting material form superconducting islands, some parts of which are topological and some parts of which are non-topological; said topological segment being one of said topological parts.

10. The method of claim 9, wherein the non-topological parts are s-wave superconductors; and wherein Majorana zero modes appear in pairs at ends of linear parts of the topological segments, and where the qubit comes into contact with either an s-wave superconductor or an insulator.

11. The method of claim 1, wherein the etching is by lithography.

12. The method of claim 1, wherein the growth of the semiconductor material and/or the depositing of the side gate is by epitaxy.

13. The method of claim 1, wherein:
the Majorana-based topological qubit is a quad qubit, and the side gate is configured to tune the Fermi energy of the topological segment; or
the Majorana-based topological qubit is a hexon qubit, and the side gate is configured to tune the Fermi energy of one or more topological segments in the network of nanowires.

14. A method of operating a quantum device fabricated according to the method of claim 1, wherein:

the topological segment of the qubit is a topologically protected segment and the side gate is located adjacent to the topologically protected segment; and the method of operating the quantum device comprises electrically controlling the side gate, and thereby creating a state in the topologically protected segment comprising a Majorana zero mode pair.

15. A quantum device comprising:

a substrate and an insulator formed on the substrate;

combinations of selective-area-grown semiconductor material along with regions of a superconducting material, forming a network of nanowires oriented in the plane of the substrate that is gateable to produce a Majorana-based topological qubit; and a side gate for controlling a topological segment of the Majorana-based topological qubit;

wherein the selective-area-grown semiconductor material is buried in trenches in the insulator which define the nanowires, and wherein side gate is also buried in a trench in the insulator.

* * * * *